United States Patent Office 3,535,176

Patented Oct. 20, 1970

3,535,176

SURFACE CONDITIONING OF SILICON FOR ELECTROLESS NICKEL PLATING

Peter J. Whoriskey, Winchester, Mass., assignor to P. R. Mallory & Co. Inc., Indianapolis, Ind., a corporation of Delaware No Drawing. Continuation-in-part of application Ser. No. 523,042, Jan. 26, 1966. This application Dec. 19, 1968, Ser. No. 785,327

Int. Cl. H01l 7/50

U.S. Cl. 156—17 3 Claims

ABSTRACT OF THE DISCLOSURE

A process for conditioning a surface of a semiconductor wafer prior to plating of an ohmic contact thereon by heating the wafer, having an active metal plated in a window area of the wafer at an elevated temperature sufficient for the metal to remove residual traces of oxygen and thereafter removing the metal plating by an etchant.

This application is a continuation-in-part of application Ser. No. 523,042, filed Jan. 26, 1966, now abandoned.

The present invention relates to the fabrication of solid state semiconductor devices, and more particularly relates to a means for conditioning semiconductor surfaces prior to the plating of ohmic contacts thereon.

Ohmic contacts for solid state semiconductor devices may be provided by electroless nickel plating to the semiconductor material. However, electroless nickel plating to silicon is inhibited by residual traces of surface and subsurface oxides which remain after conventional window etching or forming processes. The traces persist despite the fact that these surfaces have been etched with the common "oxide etchants" to effect the removal of said oxides.

The oxide surface films can prevent the plating out of nickel entirely; or if a plate is obtained, sporadic wetting during sintering of the plate results with the consequent impairment of electrical characteristics of the semiconductor device. Thus, small areas, such as the conventional window areas on the semiconductor surfaces, are difficult to plate due to the mechanism of electroless plating, and trace amounts of oxide which as previously discussed can prevent satisfactory plating.

It is an object of the present invention to provide a means for conditioning the semiconductor surfaces of solid state devices prior to electroless nickel plating.

It is an object of the present invention to provide a means for obtaining increased adhesion of nickel plate to silicon surfaces thereby resulting in improved ohmic contacts.

The present invention, in another of its aspects, relates to novel features of the instrumentalities described herein for teaching the principal object of the invention and to the novel principles employed in the instrumentalities whether or not these features and principles may be used in the said objects and/or in the said field.

Other objects of the invention and the nature thereof will become apparent from the following description.

Electroless nickel plating does not occur simultaneously across the silicon surface bounded by the oxide window, but is initiated at nucleating sites that are positioned randomly over this surface area. A uniform plate results because of bridging between the many discrete plating sites. In the formation of a semiconductor device such as a planar diode, small window areas of about 70 mils by 70 mils are bounded on all sides by oxide strips. Thus, with such window areas which are extremely small the density of nucleating sites per window area is diminished resulting in increased difficulty in nickel plating such areas.

The presence of slight or residual amounts of oxide at the window surfaces makes nucleating difficult if not impossible and thus impairs the resulting plate. It is the purpose of the present invention to effect the removal of oxides by reduction with an active metal through the medium of metallic deposition and removal.

More particularly, the present invention is directed to conditioning a surface of a semiconductor wafer prior to the plating of an ohmic contact thereon by heating the wafer having an active metal plated in the window area at an elevated temperature sufficient for the metal to remove the residual traces of oxygen and thereafter removing the metal plating by an etchant, all of which will be more fully discussed hereinafter.

At elevated temperatures, active metals, such as aluminum and titanium, will reduce silicon oxides to silicon metal, and act as oxide scavengers.

The active metal can be deposited over the window area of the semiconductor wafer by many and various methods which include vacuum evaporation, sputtering and the like.

Vacuum evaporation can be carried out in a highly evacuated glass (or metal) bell jar containing a filament, such as tungsten, which is heated to a high temperature by electric current. The metallic material is heated sufficiently by being in contact with the filament to quickly vaporize. Since the jar is under vacuum (usually $10^{-6}$ to $10^{-5}$ torr), the evaporated material radiates in all directions from the source and deposits upon the substrate which is usually heated during evaporation to promote adhesion.

Sputtering can be carried out using an apparatus similar to that for evaporation. A low vacuum (usually 0.04 to 0.1 torr) is maintained by bleeding a gas, such as argon, into the bell jar while pumping on it with a high vacuum. A glow discharge is initiated by applying a high voltage between the source (cathode) and anode. Gas ions, such as argon ions, produced by the discharge are accelerated toward the cathode and because of their sufficient energy knock atoms or molecules out of the cathode with sufficient velocity to adhere to the substrate which is positioned either in the glow region or on the anode.

The temperatures of the present process which are useful include these elevated temperatures which are sufficient for the active metal to remove, as oxide scavengers, the residual traces of oxygen and, in general, are above about 400° C. but below the temperature which seriously affects or impairs the properties of the semiconductor wafer.

Etching solutions which are useful for removing the active metal plating from the semiconductor wafer substrate include concentrated base solutions, such as inorganic bases including alkali metal hydroxides and carbonates and mixtures of these such as LiOH, KOH, NaOH, $Li_2CO_3$, $K_2CO_3$ (as well as strong organic bases including amines, ethylene diamine, triethylamine, ethylamine, methylamine and the like. Additionally, suitable etching solutions also include acidic solutions, particularly non-oxidizing acidic solutions, such as the hydrohalide acids, that is, hydrochloric acid, hydrofluoric acid and the like.

In the practice of the present invention, for example, a silicon wafer is heated to a temperature between about 400° C. and about 600° C., with 500° C. being a desirable temperature. Vacuum evaporation of aluminum over the window areas on the silicon wafer surface and the subsequent removal of aluminum by etching using a concentrated KOH solution improves the nickel platability of the wafers and the adherence of nickel thereto. The aluminum reduces the oxide and acts as an oxygen scavenger, thereby removing residual traces of oxygen from the silicon surfaces under the conditions of the present process. Prior to the utilization of this technique, no more than 5% of the silicon windows could be plated. The present invention yields 100% plating as opposed to the 5%.

The present invention, as hereinbefore described, is merely illustrative and not exhaustive in scope. Since many widely different embodiments of the invention may be made without departing from the scope thereof, it is intended that all matter contained in the above description shall be interpreted as illustrative and not in a limiting sense.

Having thus described my invention, I claim:

1. A method for conditioning the surface of a semiconductor wafer having residual traces of oxides within predetermined window areas on said surface, said window areas being utilized after conditioning for the placement of electrical contacts therein comprising the steps of:

forming a pre-selected number and volumetric size of window areas on said wafer, said window areas containing minute amounts of deleterious oxides near the surface of said wafer, heating said semiconductor wafer to a temperature below its eutectic temperature such that the properties of said wafer will not be seriously impaired, depositing an active metal selected from the group consisting of aluminum and titanium on the surface of said wafer, and removing said active metal such that any residual traces of oxides on the surface of said wafer will be removed thereby enhancing the adhesive surface characteristics of the wafer at the selected window areas upon placing said electrical contacts therein.

2. A method in accordance with claim 1, wherein said temperature is above about 400° C.

3. A method in accordance with claim 1, wherein said temperature is from within the range of 400° C. to 500° C.

References Cited

UNITED STATES PATENTS 2,854,366 9/1958 Wannlund et al. ------ 148—1.5

JACOB A. STEINBERG, Primary Examiner

U.S. Cl. X.R.

117—213